(12) United States Patent
Chinone et al.

(10) Patent No.: US 8,338,202 B2
(45) Date of Patent: Dec. 25, 2012

(54) METHOD FOR MANUFACTURING SEMICONDUCTOR DEVICE USING SEPARABLE SUPPORT BODY

(75) Inventors: Takako Chinone, Tokyo (JP); Shinichi Tanaka, Kanagawa (JP); Sho Iwayama, Kanagawa (JP); Yusuke Yokobayashi, Kanagawa (JP); Satoshi Tanaka, Tokyo (JP)

(73) Assignee: Stanley Electric Co., Ltd., Tokyo (JP)

( * ) Notice: Subject to any disclaimer, the term of this patent is extended or adjusted under 35 U.S.C. 154(b) by 771 days.

(21) Appl. No.: 12/407,290

(22) Filed: Mar. 19, 2009

(65) Prior Publication Data

US 2009/0239324 A1 Sep. 24, 2009

(30) Foreign Application Priority Data

Mar. 21, 2008 (JP) ................................. 2008-074055

(51) Int. Cl.
*H01L 21/00* (2006.01)
(52) U.S. Cl. ............................. 438/33; 438/29; 438/109
(58) Field of Classification Search .................... 438/33, 438/29, 109
See application file for complete search history.

(56) References Cited

U.S. PATENT DOCUMENTS

| 6,448,102 B1 * | 9/2002 | Kneissl et al. ................... 438/46 |
| 6,562,648 B1 * | 5/2003 | Wong et al. ...................... 438/46 |
| 6,790,695 B2 * | 9/2004 | Ogihara et al. .................. 438/33 |
| 6,806,112 B1 * | 10/2004 | Horng et al. .................... 438/29 |
| 7,098,063 B2 * | 8/2006 | Miyachi et al. ................. 438/33 |
| 7,294,521 B2 | 11/2007 | Yoo |
| 7,432,119 B2 * | 10/2008 | Doan ............................... 438/33 |
| 7,772,020 B2 * | 8/2010 | Yoo ................................. 438/29 |
| 7,939,351 B2 * | 5/2011 | Osawa et al. ................... 438/29 |
| 7,943,942 B2 * | 5/2011 | Jiang et al. ..................... 257/94 |
| 8,022,386 B2 | 9/2011 | Yoo |
| 8,106,417 B2 | 1/2012 | Yoo |
| 2003/0189212 A1 | 10/2003 | Yoo |
| 2004/0245543 A1 * | 12/2004 | Yoo ................................. 257/103 |
| 2006/0099730 A1 * | 5/2006 | Lee et al. ........................ 438/46 |
| 2006/0154390 A1 * | 7/2006 | Tran et al. ...................... 438/22 |
| 2007/0018173 A1 | 1/2007 | Yoo |

(Continued)

FOREIGN PATENT DOCUMENTS

EP 1 786 044 A1 5/2007

(Continued)

OTHER PUBLICATIONS

Japanese Office Action dated Sep. 18, 2012 (and English translation of relevant parts thereof) in counterpart Japanese Application No. 2008-074055.

*Primary Examiner* — David Vu
*Assistant Examiner* — Caleb Henry
(74) *Attorney, Agent, or Firm* — Holtz, Holtz, Goodman & Chick, PC (57) ABSTRACT

In a method for manufacturing a semiconductor device, a first conductivity type semiconductor layer and a second conductivity type semiconductor layer are sequentially grown on a growth substrate. Then, an electrode layer is formed on the second conductivity type semiconductor layer. Then, a support body is adhered to the electrode layer by providing at least one adhesive layer therebetween. Finally, at least a part of the growth substrate is removed. In this case, the adhesive layer is removable from the electrode layer.

13 Claims, 8 Drawing Sheets

U.S. PATENT DOCUMENTS

2008/0064132 A1 * 3/2008 Yoo .............................. 438/29

FOREIGN PATENT DOCUMENTS

| JP | 2003-051611 A | 2/2003 |
| --- | --- | --- |
| JP | 2003-188412 A | 7/2003 |
| JP | 2004-172351 A | 6/2004 |
| JP | 2005-109208 A | 4/2005 |
| JP | 2005-522875 A | 7/2005 |
| JP | 2005-210066 A | 8/2005 |
| JP | 2006-086388 A | 3/2006 |
| JP | 2007-142397 A | 6/2007 |

* cited by examiner

METHOD FOR MANUFACTURING SEMICONDUCTOR DEVICE USING SEPARABLE SUPPORT BODY

BACKGROUND OF THE INVENTION

1. Field of the Invention

The present invention relates to a method for manufacturing a semiconductor device such as a light emitting diode (LED).

2. Description of the Related Art

Recently, a semiconductor devices such as an LED has been required to be thinner in order to miniaturize a package for sealing the semiconductor device or directly mount the semiconductor device on a printed circuit board or the like.

As such a semiconductor device, an epi film LED has been suggested. This epi film LED can be realized by epitaxially growing semiconductor layers including an n-type semiconductor layer, an active semiconductor layer and a p-type semiconductor layer on a growth substrate, separating the grown semiconductor layers from the growth substrate, and forming electrodes on both surfaces of the grown semiconductor layers. Since the epi film LED is formed by only the semiconductor layers without the growth substrate, the epi film LED is very thin, i.e., about 3 to 10 μm thick.

In a first prior art method for manufacturing an epi film LED (see: JP-P2003-51611 A), an underlayer made of AlGaN, for example, and semiconductor layers including an n-type semiconductor layer, an active semiconductor layer and a p-type semiconductor layer are sequentially epitaxially-grown on a front surface of a growth substrate made of transparent sapphire by a metal organic chemical vapor deposition (MOCVD) process. Next, a dry etching process such as a reactive ion etching (RIE) process is carried out to form element isolation grooves for partitioning the semiconductor layers for every semiconductor element (chip), the element isolation grooves reaching the underlayer. Next, a back surface of the growth substrate is exposed with laser light whose energy is between an energy gap of the underlayer and an energy gap of one of the semiconductor layers adjacent to the underlayer to create ablations therebetween, so that the epitaxially-grown semiconductor layers are easily separated from the growth substrate along with the underlayer. Finally, electrodes are formed on both surfaces of the separated semiconductor layers to complete the semiconductor elements (chips).

In a second prior art method for manufacturing a semiconductor device (see: JP-P2004-172351 A), instead of the underlayer of the first prior art method, an exfoliation layer made of AlAs, for example, is provided between the growth substrate and the epitaxially-grown semiconductor layers. In this case, the growth substrate may be opaque, and is made of GaAs, for example. Then, the exfoliation layer is removed by a wet etching process using buffered fluoric acid or hydrogen fluoride (HF), so that the epitaxially-grown semiconductor layers are easily separated from the growth substrate.

In the above-described first and second prior art methods, however, when the separated epitaxially-grown semiconductor layers are subject to an evaporating process, a photolithography process and an etching process for forming the electrodes thereon, the separated semiconductor layers would be easily broken, thus decreasing the manufacturing yield.

SUMMARY

The present invention seeks to solve one or more of the above-mentioned problems.

According to the present invention, in a method for manufacturing a semiconductor device, a first conductivity type semiconductor layer and a second conductivity type semiconductor layer are sequentially grown on a growth substrate. Then, an electrode layer is formed on the second conductivity type semiconductor layer. Then, a support body is adhered to the electrode layer by providing at least one adhesive layer therebetween. Finally, at least a part of the growth substrate is removed. In this case, the adhesive layer is removable from the electrode layer. Since the first and second conductivity type semiconductor layers are surely fixed to the support body, they are hardly damaged even when the growth substrate is being removed.

BRIEF DESCRIPTION OF THE DRAWINGS

The above and other objects, advantages and features of the present invention will be more apparent from the following description of a certain preferred embodiment, taken in conjunction with the accompanying drawings, wherein.

DETAILED DESCRIPTION OF PREFERRED EMBODIMENT

An embodiment of the method for manufacturing a semiconductor device will now be explained with reference to FIGS. 1A through 1P.

Figure 1A:
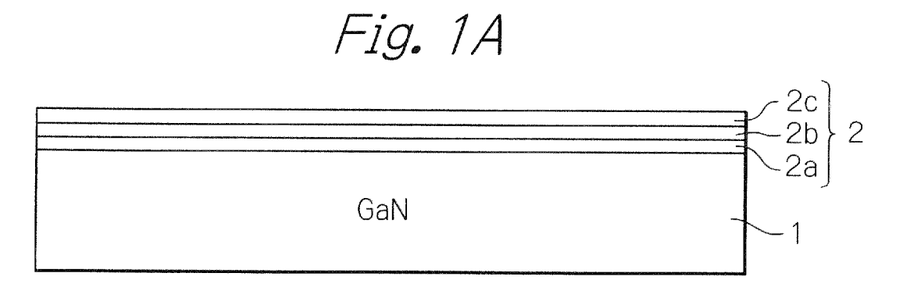
FIGS. 1A through 1P are cross-sectional views for explaining an embodiment of the method for manufacturing a semiconductor device according to the present invention.

First, referring to FIG. 1A, an about 3 μm thick n-type semiconductor layer $2a$ made of III-V group nitride, an about 0.1 μm thick active semiconductor layer $2b$ made of III-V group nitride and an about 0.1 μm thick p-type semiconductor layer $2c$ made of III-V group nitride are sequentially epitaxially-grown on an about 300 to 400 μm thick growth substrate 1 made of GaN by a MOCVD process. The semiconductor layers $2a$, $2b$ and $2c$ form a semiconductor stacked structure 2 which has good lattice matching characteristics to GaN.

The growth substrate 1 may be suitably made of sapphire, Si or SiC in the growth of the semiconductor stacked structure 2.

In view of the lattice matching characteristics, the improvement of internal quantum efficiency and the like, buffer layers, distortion relaxing layers, superlattice layers, clad layers, contact layers and the like can be included in the semiconductor stacked structure 2. Also, the active semiconductor layer $2b$ can be of a pn-junction structure, of a single quantum well structure or of a multiple quantum well structure. Further, a light extracting structure can be provided on the p-type semiconductor layer $2c$ by a photolithography process and an RIE process using chlorine gas.

Figure 1B:
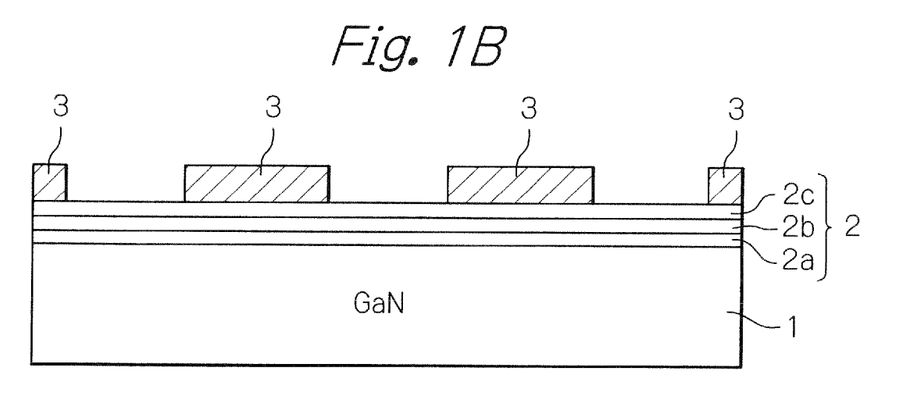

Next, referring to FIG. 1B, an about 0.3 to 100 nm thick Pt layer in ohmic contact with the p-type semiconductor layer $2c$, an about 50 to 300 nm thick Ag layer for improving the reflectivity, an about 50 to 100 nm thick Ti layer serving as an adhesive layer, an about 200 or more nm thick Pt layer for preventing the diffusion of Sn and an about 200 nm thick Au layer are sequentially deposited by an electron beam (EB) evaporating process to form an electrode layer 3. Then, the electrode layer 3 is patterned by a photolithography process and etching process. In this case, the electrode layer 3 has a reflectivity of about 80 percent to improve the light taken-out efficiency, and also, has a contact resistivity of about $1 \times 10^{-3}$ $\Omega/cm^2$ to the p-type semiconductor layer 2c.

In the electrode layer 3, the Au layer as its uppermost layer is preferable in forming a eutectic and mounting AuSn bumps or Au bumps thereon. Also, the Ag layer may be replaced by an Rh layer.

Figure 1C:
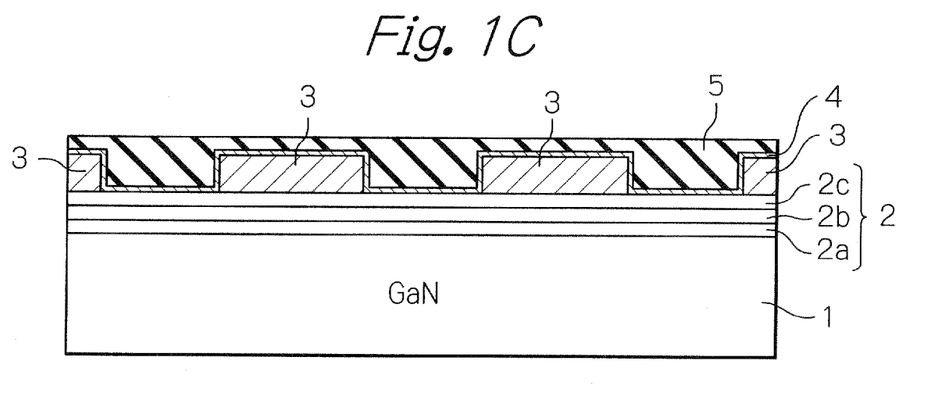

Next, referring to FIG. 1C, an about 10 nm thick Ti layer 4 is formed on the p-type semiconductor layer 2c and the electrode layer 3 by an EB evaporating process, and then, an about 100 to 500 nm thick $SiO_2$ layer 5 is formed on the Ti layer 4 by a CVD process.

Figure 1D:
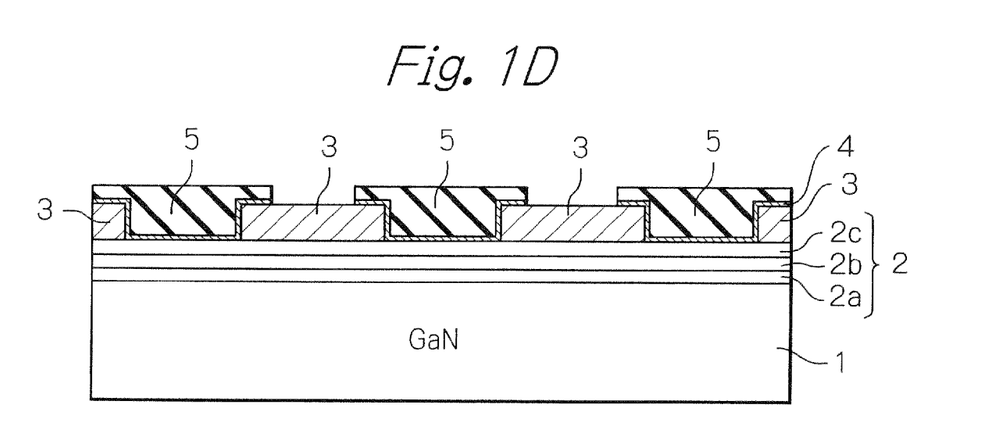

Next, referring to FIG. 1D, the $SiO_2$ layer 5 is patterned by a photolithography process and an etching process using buffered fluoric acid to expose a part of the Ti layer 4 to the air. Then, the exposed Ti layer 4 is removed by an etching process using fluoric acid in self-alignment with the patterned $SiO_2$ layer 5.

The Ti layer 4 improves the contact characteristics between the uppermost Au layer of the electrode layer 3 and the $SiO_2$ layer 5. The layer 4 may be made of other metal such as Al, Co, Cr, Fe, Mg, Mo, Ni, V, Ta, Zr or W. In this case, if the metal such as Ti or W is disadvantageous in a wet etching process, use is made of a lift-off process using a resist pattern formed by a photolithography process so as to pattern the metal before the formation of the $SiO_2$ layer 5.

Also, the $SiO_2$ layer 5 serves as a short-circuit preventing layer between semiconductor elements (chips). The layer 5 may be made of $TiO_2$, $Al_2O_3$, ZrO or HfO. The layer 5 may be formed by a lift-off process using a resist pattern formed by a photolithography process.

Figure 1E:
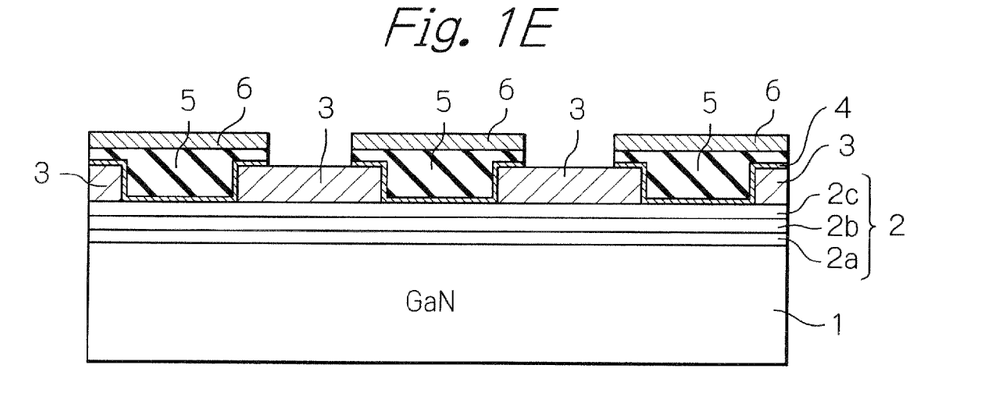

Next, referring to FIG. 1E, an auxiliary adhesive layer 6 made of Ti is formed by forming a resist pattern (not shown) on the electrode layer 3 by a photolithography process, depositing an about 100 nm thick Ti layer thereon, and removing the Ti layer on the resist pattern by a lift-off process.

Figure 1F:
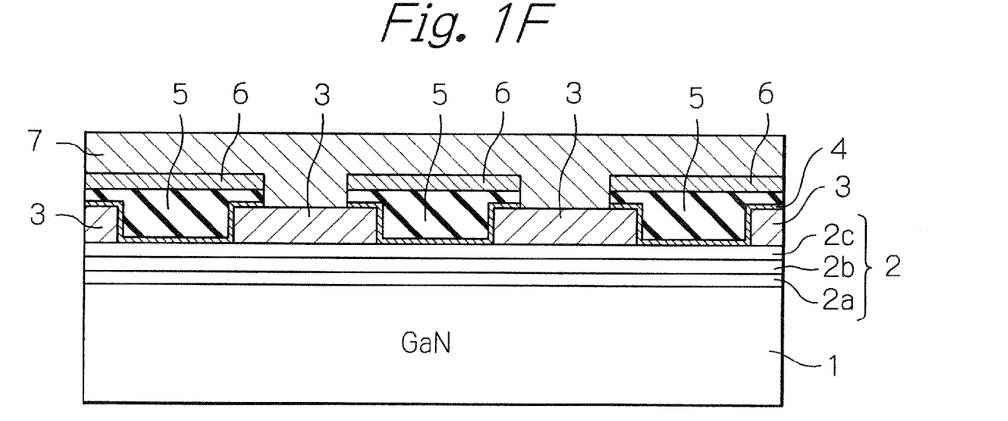

The auxiliary adhesive layer 6 has good contact characteristics to the $SiO_2$ layer 5 and an adhesive layer 7 (see FIG. 1F). The auxiliary adhesive layer 6 can be easily removed by a wet etching process using fluoric acid.

The auxiliary adhesive layer 6 may be made of other metal such as Al, Co, Cr, Fe, Mg, Mo, Ni, V, Ta, Zr or W. In this case, the metal Al, Cr, Mo, Ta or V can be removed by a wet etching process using an acid solution or alkali solution, which is not a burden on the semiconductor stacked structure 2.

Next, referring to FIG. 1F, an about 200 nm thick TaN layer, an about 100 nm thick TiW layer and an about 100 nm TaN layer are sequentially deposited on the auxiliary adhesive layer 6 and the exposed electrode layer 3 by a reactive sputtering process to form an about 400 nm thick adhesive layer 7. In this case, the adhesive layer 7 can be easily removed from the electrode layer 3.

The adhesive layer 7 may be made of other material such as TiN, NbN, VN or ZrN which hardly reacts with the uppermost Au layer of the electrode layer 3. Also, the adhesive layer 7 may be about 200 to 500 nm thick.

Also, since reaction gas is generated during the reactive sputtering process and occluded in the adhesive layer 7, the adhesive layer 7 is in a compressive state, so that the adhesive layer 7 can be easily exfoliated by a compressive stress therein at a post stage.

Figure 1G:
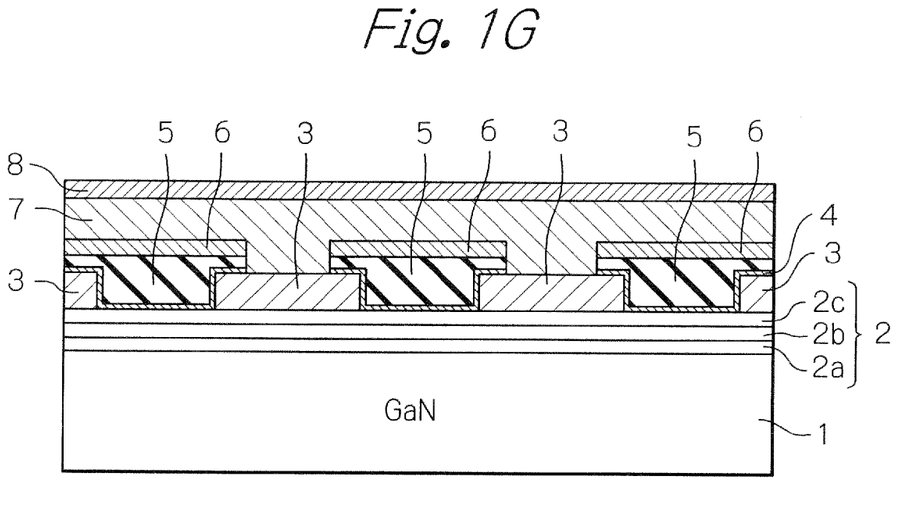

Next, referring to FIG. 1G, an about 300 nm thick Ni layer and an about 30 nm thick Au layer are sequentially deposited on the adhesive layer 7 by an EB evaporating process to form a support body adhesive layer 8 for adhering a support body 9 (see FIG. 1H) thereto.

In the support body adhesive layer 8, the Ni layer has good contact characteristics between the Au layer and the adhesive layer 7, and the Au layer is used for forming a eutectic. In order to suppress an internal stress within the Ni layer due to its stacked structure, the Ni layer needs to be thicker than 150 nm, i.e., about 150 to 450 nm, so that the Ni layer is hardly exfoliated.

In the support body adhesive layer 8, the Ni layer may be replaced by a metal layer made of Al, Co, Cr, Fe, Mg, Mo, Ni, V, Ta, Ti, Zr, W, Mo or Pd which has good contact characteristics to Au; however, the Ni layer is most advantageous in view of the small difference in thermal expansion coefficient between Ni and Au.

Figure 1H:
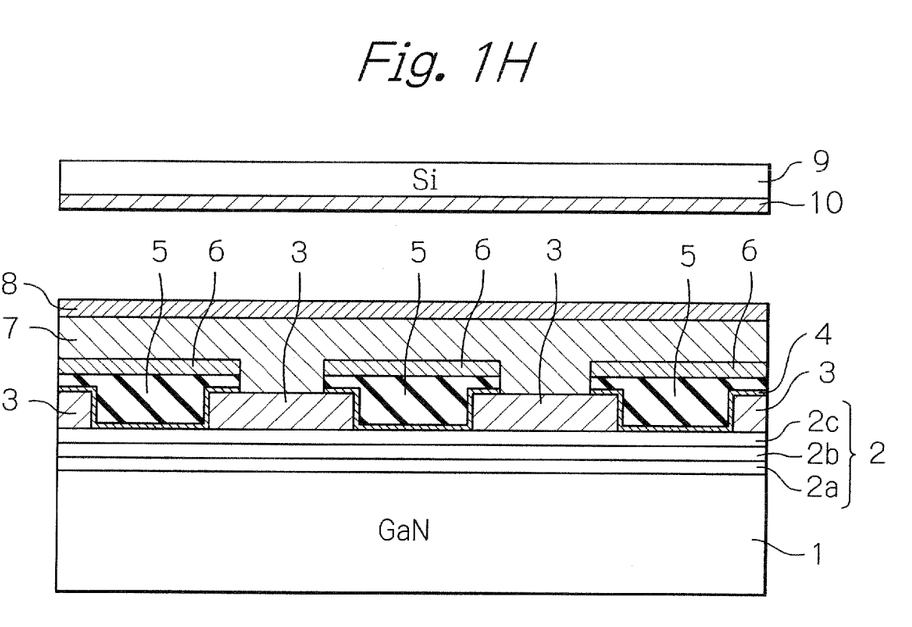

Next, referring to FIG. 1H, a Si substrate 9 is prepared as a support body. Then, a Pt layer, a Ti layer, a Ni layer and an AuSn layer are sequentially deposited on the Si substrate 9 by an EB evaporating process to form an adhesive layer 10.

Figure 1I:
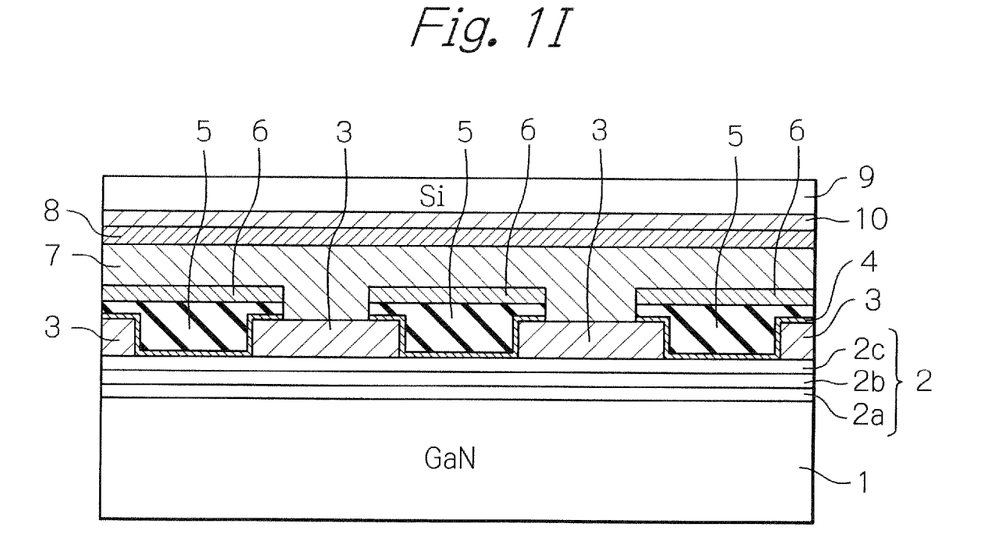

Next, referring to FIG. 1I, the Si substrate 9 as the support body along with the adhesive layer 10 is thermally pressed onto the adhesive layer 8 under a vacuum pressure of less than 50 Pa weighed with 10 MPa at a temperature of about 320° C. for a predetermined time period.

In the adhesive layer 10, the Pt layer is used for forming Pt silicide after the thermal-pressing, which is helpful in testing a completed semiconductor element by supplying a current thereto through the Pt silicide. The Ti layer improves the contact characteristics between the Pt silicide and the support body adhesive layer 8. The Ni layer improves the wettability of the AuSn layer. The Au layer prevents the Ni layer from being oxidized. The AuSn layer is used for forming a eutectic.

The materials of the adhesive layer 10 may be changed. Also, the above-mentioned thermal pressing can be carried out in an inert gas atmosphere such as a nitrogen gas atmosphere, not under a vacuum pressure.

Figure 1J:
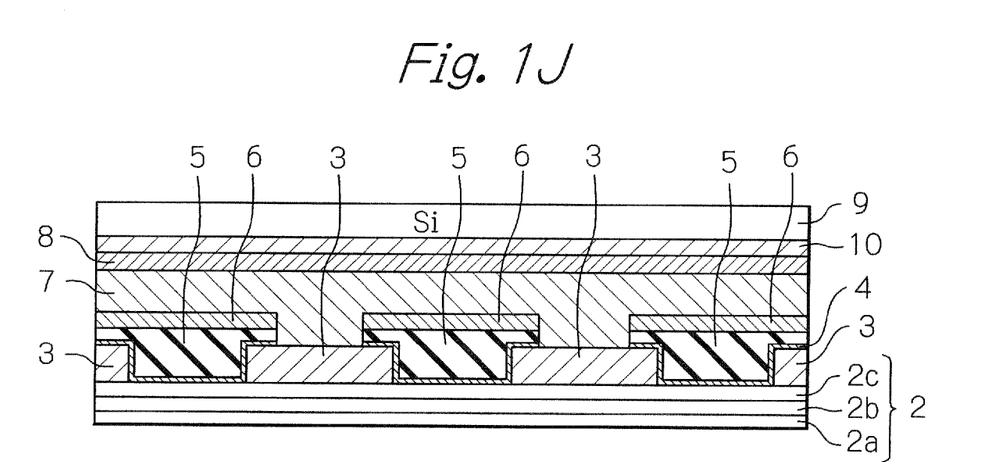

Next, referring to FIG. 1J, the back surface of the growth substrate 1 is polished by a chemical mechanical polishing (CMP) process so that the growth substrate 1 is made about 10 to 20 µm thick. Then, the growth substrate 1 is completely removed by a dry etching process. In this case, a part of the semiconductor stacked structure 2 is also etched by this dry etching process, so that the semiconductor stacked structure 2 is made about 3 to 4 µm thick.

Note that, since the semiconductor stacked structure 2 along with the electrode layer 3 is securely fixed to the Si substrate (support body) 9 by the adhesive layers 6, 7, 8 and 10, the semiconductor stacked structure 2 is hardly damaged when the growth substrate 1 is removed.

If the growth substrate 1 is made of conductive material such as GaN, a part of the growth substrate 1 can be left even after the dry etching process. In this case, since there is no substantial difference in refractive index between the growth substrate 1 and the semiconductor stacked structure 2, the mechanical strength can be enhanced without, decreasing the light extraction efficiency.

Also, if the growth substrate 1 is made of sapphire, Si or SiC, the growth substrate 1 can be removed by laser irradiation or other etching processes.

Figure 1K:
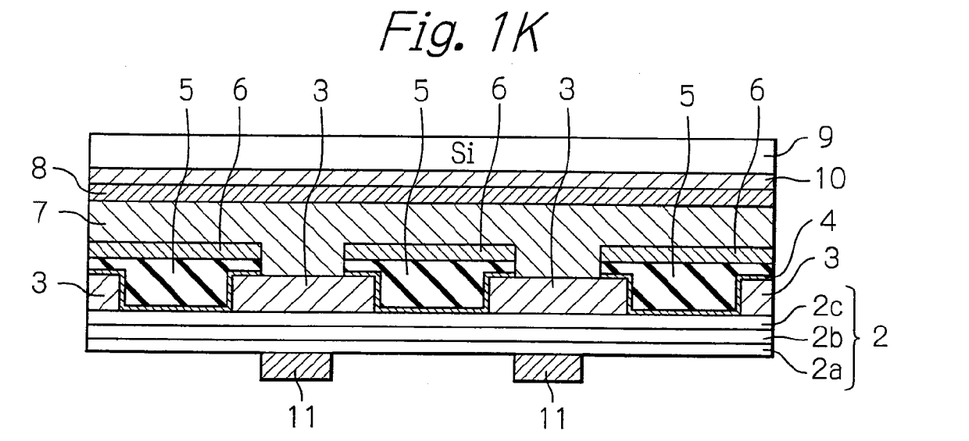

Next, referring to FIG. 1K, a Ti layer, an Al layer and an Au layer are sequentially deposited on the n-type semiconductor layer 2a by an EB evaporating process and are patterned by a photolithography and etching process to form an electrode layer 11 which has a contact resistance of less than $1 \times 10^{-4}$ $\Omega/cm^2$ to the n-type semiconductor layer 2a.

In the electrode layer 11, the Ti layer and the Al layer may be replaced by an Al layer and an Rh layer, an Al layer and an Ir layer, or an Al layer and a Pt layer.

Even in this ease, since the semiconductor stacked structure 2 along with the electrode layer 3 is securely fixed to the Si substrate (support body) 9 by the adhesive layers 6, 7, 8 and 10, the semiconductor stacked structure 2 is hardly damaged by forming the electrode layer 11.

Figure 1L:
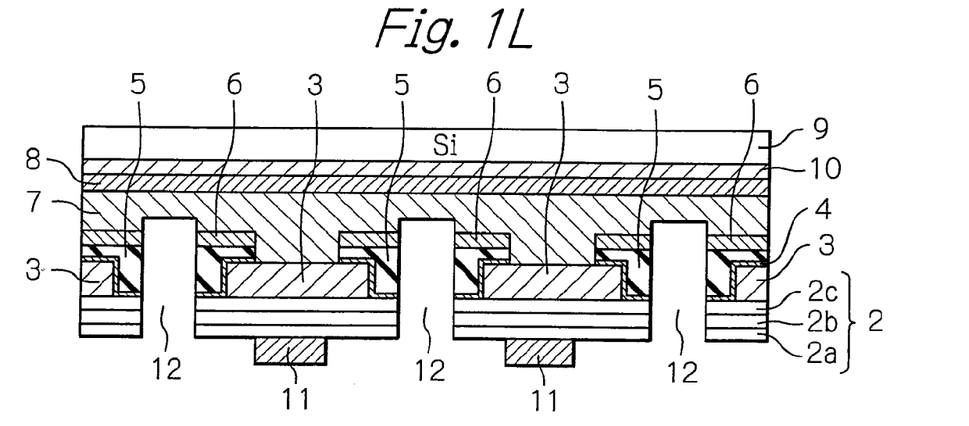

Next, referring to FIG. 1L, the n-type semiconductor layer 2a, the active semiconductor layer 2b, the p-type semiconductor layer 2c, the auxiliary adhesive layer 6 and a part of the adhesive layer 7 are cut by a dicing apparatus to form element isolation grooves 12 for partitioning the semiconductor layers 2a, 2b and 2c for each semiconductor element (chip).

In FIG. 1L, note that, a resist pattern (not shown) can be formed on the n-type semiconductor layer 2a by a photolithography process. Then, the n-type semiconductor layer 2a, the active semiconductor layer 2b, the p-type semiconductor layer 2c and a part of the auxiliary adhesive layer 6 can be etched by a reactive etching process using the resist pattern as a mask to form shallower element isolation grooves for partitioning the semiconductor layers 2a, 2b and 2c for each semiconductor element (chip).

Even in this case, since the semiconductor stacked structure 2 along with the electrode layer 3 is securely fixed to the Si substrate (support body) 9 by the adhesive layers 6, 7, 8 and 10, the semiconductor stacked structure 2 is hardly damaged when the element isolation grooves are formed.

Figure 1M:
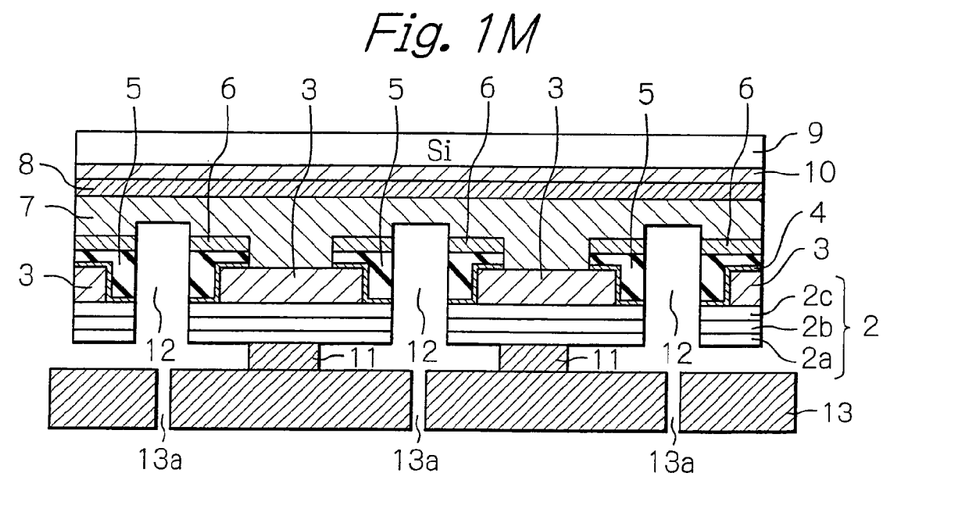

Next, referring to FIG. 1M, an acid-resistant adhesive tape 13 with perforations 13a is adhered to the electrode layer 11 to fix the semiconductor elements (chips) partitioned by the element isolation grooves 12 to each other. In this case, when the adhesive tape 13 is irradiated with ultraviolet rays, the adhesive force of the adhesive tape 13 is decreased, so that the adhesive tape 13 can be easily exfoliated from the electrode layer 11; however, the adhesive force between the adhesive tape 13 and the electrode layer 11 that is not irradiated with ultraviolet rays is sufficiently larger than that between the adhesive layer 7 and the electrode layer 3. Such an adhesive tape is "Backgrinding and Etching Tape SP Series" (trademark) manufactured by Furukawa Electric Industry Co., Ltd.

Figure 1N:
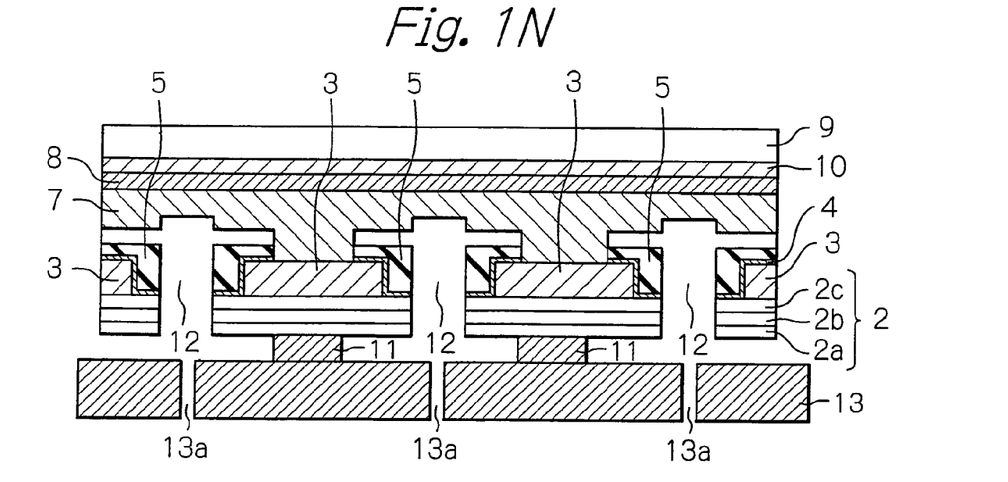

Next, referring to FIG. 1N, the auxiliary adhesive layer 6 is removed by a wet etching process using fluoric acid which passes through the perforations 13a to reach the auxiliary adhesive layer 6. Note that this wet etching process is carried out for a predetermined time period to completely remove the auxiliary adhesive layer 6. In this case, since the Ti layer 4 is covered by the SiO$_2$ layer 5, the Ti layer 4 is hardly etched by the fluoric acid. Also, since the adhesive tape 13 is acid-resistant, the adhesive tape 13 is never etched.

In this state, the adhesive force between the semiconductor stacked structure 2 and the Si substrate (support body) 9 depending only on the adhesive force between the electrode layer 3 and the adhesive layer 7 is decreased.

Figure 1O:
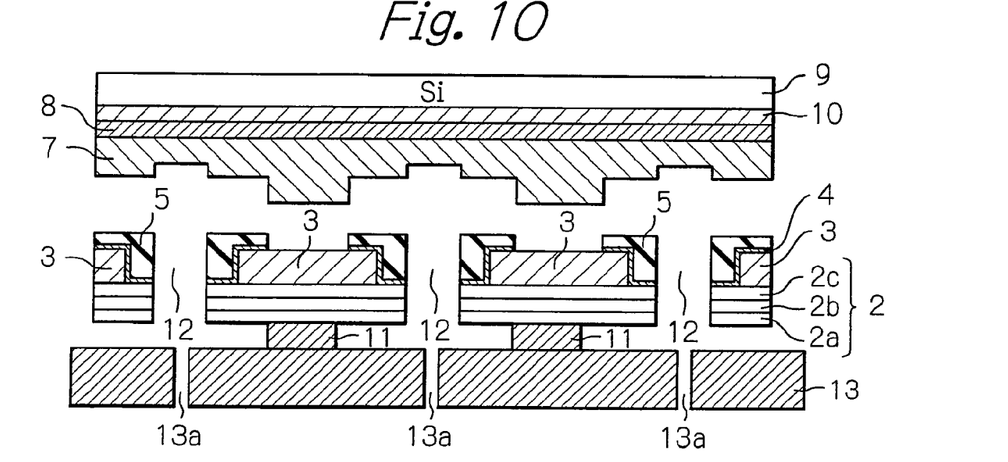

Next, referring to FIG. 1O, while the Si substrate (support body) 9 is fixed at a support table (not shown), the adhesive tape 13 is pulled out. As a result, since the adhesive force between the adhesive tape 13 and the electrode layer 11 is sufficiently larger than that between the adhesive layer 7 and the electrode layer 3, semiconductor elements (chips) each formed by the semiconductor stacked structure 2, the electrode layer 3, the Ti layer 4, the SiO$_2$ layer 5 and the electrode layer 11 adhered to the adhesive tape 13 are separated from the adhesive layers 7, 8 and 10, and the Si substrate (support body) 9.

Figure 1P:
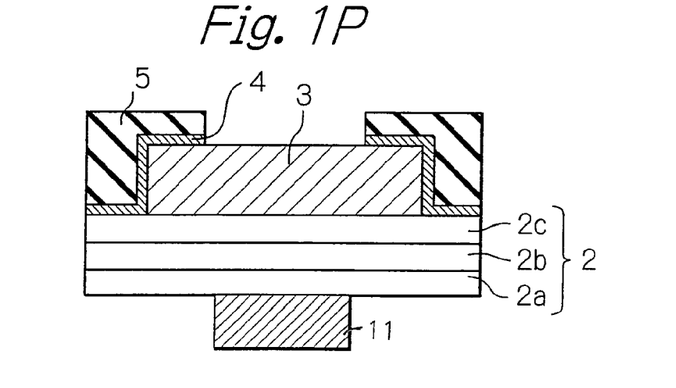

Finally, when the adhesive tape 13 is irradiated with ultraviolet rays, the adhesive force of the adhesive tape 13 is decreased, so that the semiconductor elements (chips) each as illustrated in FIG. 1P are separated from the adhesive tape 13.

According to the above-described embodiment, since the semiconductor stacked structure 2 along with the electrode layer 3 is mechanically supported by the Si substrate (support body) 9 through the adhesive layers 6, 7, 8 and 10, when the growth substrate 1 is being removed by a CMP process and the like and when the electrode layer 11 is being formed by an EB evaporating process and the like, the semiconductor stacked structure 2 along with the electrode layer 3 is hardly damaged, which would increase the manufacturing yield. Also, since the removal of the growth substrate 1 is carried out without damaging the semiconductor stacked structure 2 along with the electrode layer 3, the manufacturing speed can be enhanced.

Also, in the above-described embodiment, instead of providing the adhesive tape 13, the semiconductor elements (chips) each formed by the semiconductor stacked structure 2, the Ti layer 4 and the SiO$_2$ layer 5 can be separated from the adhesive layers 7, 8 and 10 and the Si substrate 9 by applying ultrasonic waves, heat, vibrations or physical shocks thereto after the auxiliary adhesive layer 6 is removed by a wet etching process.

Figure 2A:
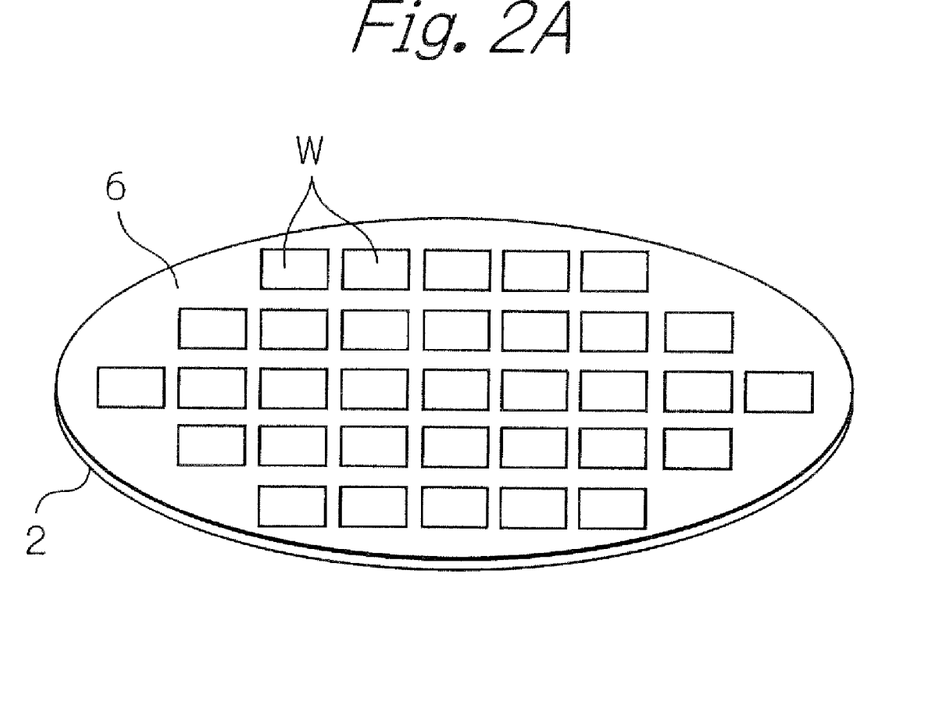
FIGS. 2A and 2B are perspective views of modification of the auxiliary adhesive layer of FIG. 1K.
Figure 2B:
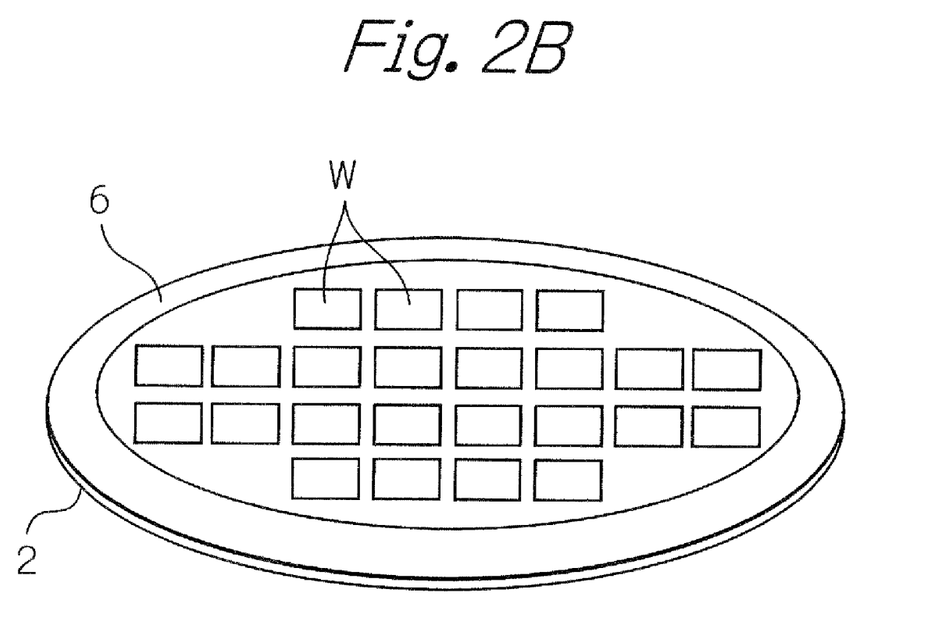

Further, in the above-described embodiment, the auxiliary adhesive layer 6 is formed on the SiO$_2$ layer 5 of each semiconductor element (chip) as illustrated in FIG. 1K; however, the auxiliary adhesive layer 6 can be formed on the SiO$_2$ layer 5 at a periphery of each of a plurality of semiconductor chips as indicated by a work sheet W in FIG. 2A, and the auxiliary adhesive layer 6 can be formed on the SiO$_2$ layer 5 at a periphery of each of a plurality of work sheets W as indicated in FIG. 2B. Further, if the SiO$_2$ layer 5 is not provided, the auxiliary adhesive layer 6 can be formed on the p-type semiconductor layer 2c. In any case, after the auxiliary adhesive layer 6 is removed, the semi conductor stacked structure 2 along with the electrode layers 3 and 11 can be easily separated from the Si substrate (support body) 9.

Figure 3:
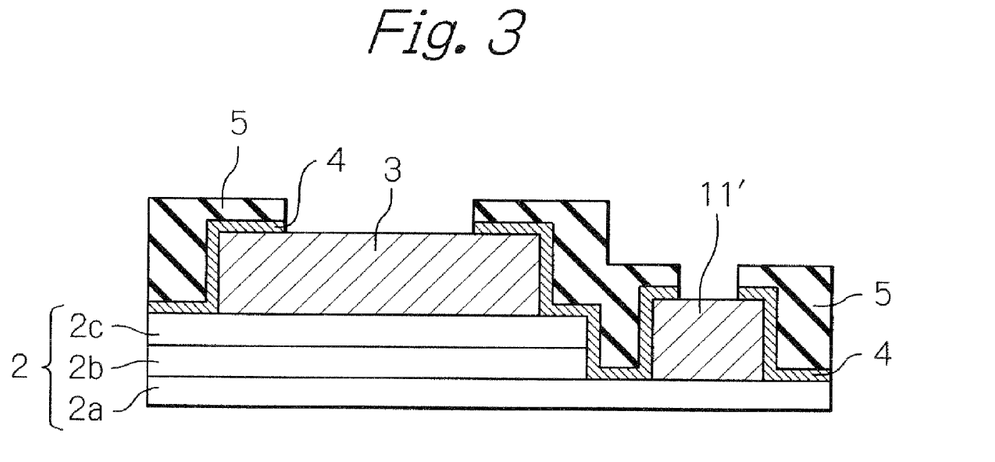
FIG. 3 is a cross-sectional view of a flip-chip type semiconductor device to which the present invention is applied.

Further, the present invention can be applied to a method for manufacturing a flip-chip type semiconductor device where an electrode layer 11' as well as the electrode layer 3 is provided on the upper surface of the semiconductor stacked structure 2, particularly, on the n-type semiconductor layer 2a as illustrated in FIG. 3.

A method for manufacturing the semiconductor device as illustrated in FIG. 3 is similar to the above-described embodiment.

That is, after the semiconductor stacked structure 2 is formed, semiconductor layers 2b and 2c are etched for accommodating the electrode layer 11'. The electrode layer 11' can be formed simultaneously with the formation of the electrode layer 3 (see: FIG. 1B). Thereafter, the steps as illustrated in FIGS. 1C through 1J, 1L, 1M, 1N and 1O are carried out. In this case, the adhesive tape 13 is adhered to the n-type semiconductor layer 2a. Of course, it is required that the adhesive force between the adhesive tape 13 and the n-type semiconductor layer 2a be sufficiently larger than that between the adhesive layer 7 and the electrode layer 3.

Still, the above-described embodiment relates to a III-V group semiconductor nitride for emitting blue rays; however, the present invention can be applied to a AlInGaP semiconductor device for emitting other color light rays.

The invention claimed is:

1. A method for manufacturing a semiconductor device, comprising:

sequentially growing a first conductivity type semiconductor layer and a second conductivity type semiconductor layer on a growth substrate;

forming a first electrode layer on said second conductivity type semiconductor layer;

adhering a support body to said first electrode layer by providing at least one adhesive layer therebetween, said adhesive layer comprising metal alloy in a compression state, removing at least a part of said growth substrate after said support body is adhered to said first electrode layer, said adhesive layer being removable from said first electrode layer;

forming element isolation grooves in said first and second conductivity type semiconductor layers, said element isolation grooves reaching said adhesive layer; and separating said first and second conductivity type semiconductor layers along with said first electrode layer from said support body along with said adhesive layer by applying one of an ultrasonic wave, heat, vibration and physical shock to said support body.

2. A method for manufacturing a semiconductor device, comprising:

sequentially growing a first conductivity type semiconductor layer and a second conductivity type semiconductor layer on a growth substrate;

forming a first electrode layer on said second conductivity type semiconductor layer;

adhering a support body to said first electrode layer by providing at least one adhesive layer therebetween, said adhesive layer comprising metal alloy in a compression state;

removing at least a part of said growth substrate after said support body is adhered to said first electrode layer, said adhesive layer being removable from said first electrode layer;

forming a second electrode layer on one of said first conductivity type semiconductor layer and an exposed surface of said partly-removed growth substrate;

forming element isolation grooves in said first and second conductivity type semiconductor layers, said element isolation grooves reaching said adhesive layer;

adhering an adhesive tape on said second electrode layer, an adhesive force between said adhesive tape and said second electrode layer being larger than an adhesive force between said first electrode layer and said adhesive layer; and pulling said adhesive tape with respect to said support body so that said adhesive tape, said first and second conductivity type semiconductor layers and said first and second electrode layers are separated from said support body along with said adhesive layer.

3. The method as set forth in claim 1, further comprising:

removing a part of said second conductivity type semiconductor layer to expose a part of said first conductivity type semiconductor layer; and forming a second electrode layer on the part of said first conductivity type semiconductor layer.

4. The method as set forth in claim 2, further comprising separating said adhesive tape from said second electrode layer after said adhesive tape is pulled.

5. The method as set forth in claim 2, further comprising:

forming an auxiliary adhesive layer on a part of said first electrode layer before providing said adhesive layer; and removing said auxiliary adhesive layer by a wet etching process after said element isolation grooves are formed and before said adhesive tape is adhered.

6. The method as set forth in claim 5, further comprising forming an insulating layer on a part of said first electrode layer before said auxiliary adhesive layer is formed, said auxiliary adhesive layer being formed on said insulating layer.

7. The method as set forth in claim 5, wherein perforations are formed in said adhesive tape, so that said auxiliary adhesive layer is easily removed by said wet etching process.

8. The method as set forth in claim 1, wherein said semiconductor device is a light emitting diode.

9. A method for manufacturing a light emitting diode, comprising:

sequentially growing a first conductivity type semiconductor layer, an active layer and a second conductivity type semiconductor layer;

forming first electrodes on said second conductivity type semiconductor layer;

forming an insulating layer on said second conductivity type semiconductor layer, said insulating layer being adapted to insulate said first electrodes from each other;

forming an auxiliary adhesive layer on said insulating layer;

forming a first adhesive layer on said first electrodes and said auxiliary adhesive layer;

forming a second adhesive layer on said first adhesive layer;

forming a third adhesive layer on a support body;

thermally-pressing said support body along with said third adhesive layer onto said second adhesive layer;

forming second electrodes on said first conductivity type semiconductor layer after said thermal pressing is carried out;

forming element isolation grooves in said first and second semiconductor layers and said auxiliary adhesive layer after said second electrodes are formed;

adhering an adhesive tape with perforations on said second electrodes after said element isolation grooves are formed;

performing a wet etching process upon said auxiliary adhesive layer through the perforations of said adhesive tape;

pulling said adhesive tape with respect to said support body, so that said first electrodes are separated from said first adhesive layer; and removing said adhesive tape by applying ultraviolet rays thereto after said adhesive tape is pulled, so that light emitting diodes each formed of said first conductivity type semiconductor layer, said active semiconductor layer, said second conductivity type semiconductor layer, said insulating layer, one of said first electrodes and one of said second electrodes are separated from each other.

10. The method as set forth in claim 1, wherein said metal alloy comprises a stacked structure of TaN, TiW, and TaN.

11. The method as set forth in claim 1, wherein said metal alloy comprises one of TiN, NbN, VN, and ZrN.

12. The method as set forth in claim 1, wherein said adhesive layer comprises a eutectic material.

13. The method as set forth in claim 9, wherein said adhesive layer comprises metal alloy in a compression state.

* * * * *